(12) United States Patent
Berzins et al.

(10) Patent No.: US 7,583,121 B2
(45) Date of Patent: Sep. 1, 2009

(54) FLIP-FLOP HAVING LOGIC STATE RETENTION DURING A POWER DOWN MODE AND METHOD THEREFOR

(75) Inventors: Matthew S. Berzins, Cedar Park, TX (US); Charles A. Cornell, Austin, TX (US); Samuel J. Tower, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 11/847,424

(22) Filed: Aug. 30, 2007

(65) Prior Publication Data
US 2009/0058485 A1    Mar. 5, 2009

(51) Int. Cl.
*H03K 3/289* (2006.01)
(52) U.S. Cl. .......................... 327/202; 327/218
(58) Field of Classification Search ............. 327/212, 327/202, 218
See application file for complete search history.

(56) References Cited

U.S. PATENT DOCUMENTS

| | | | |
|---|---|---|---|
| 6,870,412 B2 | 3/2005 | Cho | |
| 6,873,197 B2 | 3/2005 | Kanba | |
| 7,123,068 B1 * | 10/2006 | Hoover et al. | 327/202 |
| 7,138,842 B2 * | 11/2006 | Padhye et al. | 327/203 |
| 7,164,301 B2 | 1/2007 | Chun | |
| 7,183,825 B2 | 2/2007 | Padhye et al. | |

* cited by examiner

*Primary Examiner*—Lincoln Donovan
*Assistant Examiner*—Daniel Rojas
(74) *Attorney, Agent, or Firm*—Daniel D. Hill; James L. Clingan, Jr.

(57) ABSTRACT

A flip-flop includes a master latch, a first inverter, a slave latch, and a first clocked inverter. The master latch has an input for receiving an input signal and an output. The first inverter has an input coupled to the output of the master latch and an output for providing an output of the flip-flop. The slave latch is directly connected to the input of the first inverter. The first clocked inverter has an input directly connected to the slave latch and an output coupled to the master latch.

19 Claims, 3 Drawing Sheets

FLIP-FLOP HAVING LOGIC STATE RETENTION DURING A POWER DOWN MODE AND METHOD THEREFOR

BACKGROUND

1. Field

This disclosure relates generally to flip-flops, and more specifically, to a flip-flop having logic state retention during a power down mode and method therefor.

2. Related Art

Lower power consumption has been gaining importance in integrated circuit data processing systems due to, for example, wide spread use of portable and handheld applications. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current of integrated circuits is to increase the threshold voltage of the transistors in the device. However, simply increasing the threshold voltage of the transistors may result in unwanted consequences such as slowing the operating speed of the device and limiting circuit performance.

Another method that has been used to reduce leakage current is to "power gate", or cut off power to certain blocks of the integrated circuit that are not needed when the device is in a low power, or sleep, mode. However, in doing so, the state of the circuit block is lost if a means is not provided to retain the state while in "power down" mode. In a state retention flip-flop, a separate latch may be provided to retain the logic state of the flip-flop during power down mode. While in power down mode, only the separate latch receives a power supply voltage while the other circuits are powered down. However, when entering and exiting power down mode, various clock state restrictions may apply to the state retention flip-flop. The clock state restrictions may be difficult to comply with in some applications. Also, when entering or exiting power down mode, the output of some state retention flip-flops may toggle between logic states. Depending on the application, these characteristics may be undesirable.

Therefore, it would be desirable to have a state retention flip-flop that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect there is provided, a flip-flop, comprising: a master latch having an input for receiving an input signal and an output; a first inverter having an input coupled to the output of the master latch and an output for providing an output of the flip-flop; a slave latch directly connected to the input of the first inverter; and a first clocked inverter having an input directly connected to the slave latch and an output coupled to the master latch.

In another aspect there is provided, a method comprising: during a normal mode of operation: latching an input signal in a master latch on a first edge of a clock signal; selectively coupling the input signal to an output circuit; and latching the input signal in a slave latch that is directly connected to the output circuit on a second edge of the clock signal; in response to entering a power down period: disabling the master latch; and coupling the slave latch to the master latch; during a portion of the power down period; removing power from the master latch and the output circuit while retaining power to the slave latch; and in response to a termination of the power down period, which occurs after power has returned to the master latch, decoupling the slave latch from the master latch.

In yet another aspect there is provided, a flip-flop comprising: a master latch having an input for receiving an input signal and output; an output circuit coupled to the master latch for providing an output signal of the flip-flop; a slave latch directly connected to the output circuit for storing a logic state received by the output circuit; and a first clocked inverter having an input directly connected to the slave latch and an output coupled to the master latch for providing the logic state stored in the slave latch to the master latch at a time prior to termination of a power down period; wherein the slave latch provides the logic state stored in the slave latch to the output circuit at the time prior to termination of a power down period, and wherein the output circuit provides the output signal responsive to the slave latch providing the logic state stored in the slave latch.

Figure 1:
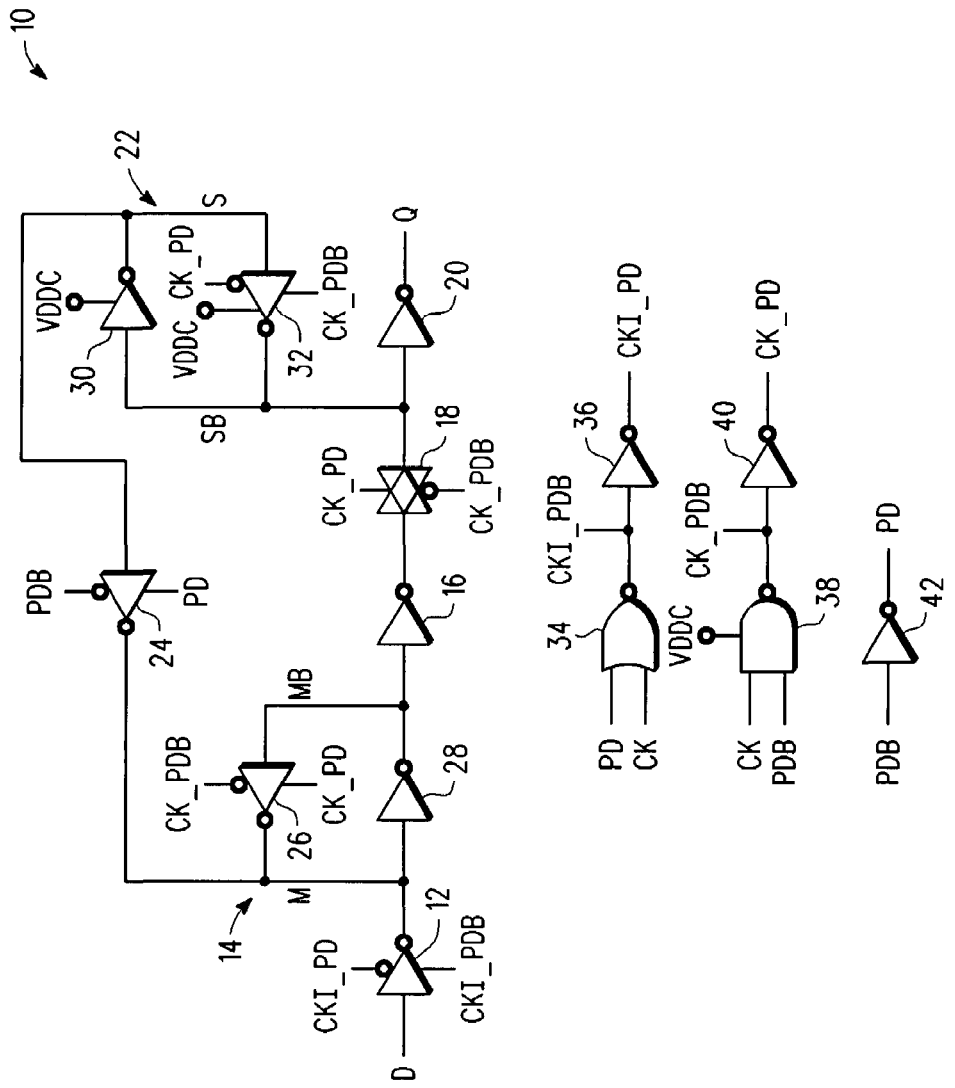
FIG. 1 illustrates, in logic diagram form, a state retention flip-flip in accordance with one embodiment.

FIG. 1 illustrates, in logic diagram form, a state retention flip-flip 10 in accordance with one embodiment. Flip-flop 10 includes clocked inverters 12 and 24, master latch 14 and slave latch 22, transmission gate 18, inverters 16, 20, 36, 40, and 42, NOR logic gate 34, and NAND logic gate 38. Master latch 14 includes clocked inverter 26 and inverter 28. Slave latch 22 includes inverter 30 and clocked inverter 32.

Clocked inverter 12 has an input for receiving an input signal labeled "D", an output, a first control input for receiving a clocked power down control signal labeled "CKI_PD", and a second control input for receiving a second clocked power down control signal labeled "CKI_PDB". Note that a "B" following a signal name indicates that the signal is a logical complement of a signal having the same name but lacking the "B". Inverter 28 has an input coupled to the output of inverter 12, and an output for providing an internal signal labeled "MB". Clocked inverter 26 has an input coupled to the output of inverter 28, an output coupled to the input of inverter 28 for providing an internal signal labeled "M", a first control input for receiving a clocked power down control signal labeled "CK_PDB", and a second control input for receiving a clocked power down control signal labeled "CK_PD". Inverter 16 has an input coupled to the output of inverter 28, and an output. Transmission gate 18 has an input coupled to the output of inverter 16, an output, a first control input for receiving control signal CK_PD, and a second control input for receiving control signal CK_PDB. Inverter 20 has an input coupled to the output of transmission gate 18, and an output for providing an output signal labeled "Q". Inverter 30 has an input coupled to the output of transmission gate 18, and an output for providing an internal signal labeled "S". Clocked inverter 32 has an input coupled to the output of inverter 30, an output coupled to the input of inverter 30 for providing an internal signal labeled "SB", a first control input for receiving control signal CK_PD, and a second control input for receiving control signal CK_PDB. Clocked inverter 24 has an input directly connected to the output of inverter 30, an output directly connected to the input of inverter 28, a first control input for receiving a power down control signal labeled "PDB", and a second input for receiving a power down control signal labeled "PD". Note that in another embodiment, the output of inverter 28 may be coupled to the input of inverter 28 instead of directly connected. Note that power down control signal PDB is asserted, or active as a logic low. Likewise, power down control signal PDB is deasserted, or inactive as a logic high.

NOR logic gate 34 has a first input for receiving power down control signal PD, a second input for receiving a clock signal labeled "CK", and an output for providing clocked power down control signal CKI_PDB. Inverter 36 has an input coupled to the output of NOR logic gate 34, and an output for providing control signal CKI_PD. NAND logic gate 38 has a first input for receiving clock signal CK, a second input for receiving power down control signal PDB, and an output for providing clocked power down control signal CK_PDB. Inverter 40 has an input coupled to the output of NAND logic gate 38, and an output for providing control signal CK_PD. Inverter 42 has an input for receiving control signal PDB, and an output for providing control signal PD. As illustrated in FIG. 1, inverters 30 and 32 and NAND logic gate 38 each receive a continuous power supply voltage labeled "VDDC". That is, circuits labeled to receive power supply voltage VDDC receive a power supply all the time, without regard to the operating mode. All of the other logic gates in FIG. 1 receive an interruptible power supply voltage (VDD in FIG. 2) that is interrupted, turned off, or disconnected from the circuits supplied by VDD when an integrated circuit device (not shown) having flip-flop 10 enters a power down operating mode.

During normal operation, that is, when an integrated circuit that includes flip-flop 10 is not in a power down mode, flip-flop 10 functions as a conventional DQ type flip-flop having master latch 14 and slave latch 22. When the integrated circuit is operating in a power down mode, the logic state of flip-flop 10 is retained in slave latch 22, which is supplied by VDDC as illustrated in FIG. 1, while master latch 14 and the rest of the flip flop is powered down. Note that NAND logic gate 38 supplies slave latch 22 with control signals CK_PD/CK_PDB and is also powered by VDDC. Typically, the clock signal is stopped while in power down mode. In flip-flop 10, a logic state is retained in slave latch 22 independent of the logic state of clock signal CK and the output Q of flip-flop 10 does not change on entry or exit of power down mode. Clock signal CK can be stopped with any logic state, i.e. either a logic high or a logic low, as long as the clock signal is static. Note that the clock signal only has to be static during assertion or deassertion of power down control signal PDB. By allowing the clock to be stopped at any state, and by providing a stable output signal during entry and exit to power down mode, flip-flop 10 can be implemented in applications having various specific output and clocking requirements. Also, state retention flip-flop 10 has a fewer number of components and is relatively small to implement on an integrated circuit.

When flip-flop 10 is not operating in a power down mode, power down signal PD is a logic low. As can be seen in FIG. 1, when power down signal PD is a logic low, a logic state of the output of NOR logic gate 34 (CKI_PD) toggles between a logic high and a logic low every time clock signal CK toggles. Likewise, power down signal PDB is a logical complement of signal PD and is a logic high when flip-flop 10 is not in power down mode. The output of NAND logic gate 38 (CK_PDB) toggles every time clock signal CK toggles when signal PD is a logic high. The input signal D is inverted by clocked inverter 12 and provided to the input of latch 14 every time CKI_PDB is a logic high. Master latch 14 includes a pair of cross-coupled inverters 26 and 28 for retaining the logic state of latch signal M when CK_PDB is a logic low. When CK_PDB is high, inverter 26 is disabled allowing signal M to be provided by inverter 12. As can be seen in FIG. 1, when inverter 12 is enabled by a falling clock CK, transmission gate 18 is disabled. When inverter 12 is disabled by a rising clock CK, then transmission gate 18 is enabled to transfer the logic state of signal M to the inputs of inverters 20 and 30. When control signal CK_PDB is a logic high inverter 32 is enabled and the logic state of signal SB is latched by slave latch 22, while inverter 20 provides output signal Q. Also during a normal operating mode, the logic low power down control signal PD causes inverter 24 to be disabled.

Control signals PD/PDB and clock signal CK are user, or externally, provided. Power down mode is entered when power down control signal PDB is asserted as a logic low voltage. Typically clock signal CK is stopped as a logic low. However, in the described embodiment, the clock signal CK can be stopped as either a logic high or a logic low without affecting the operation of flip-flop 10 during power down mode. In response to receiving an asserted logic low power down signal PDB, the output of NOR logic gate 34 is held at a logic zero irrespective of the logic state of clock signal CK. Also, NAND logic gate 38 provides a logic high irrespective of the logic state of clock signal CK.

When power down control signal PDB is asserted as a logic low to enter power down mode, and while VDD is still being supplied, inverter 24 is enabled to transfer the logic state of slave latch 22 to master latch 14, thus ensuring that the logic state of master latch 14 mirrors the logic state of slave latch 22. Note that the output of NAND logic gate 38 is held at a logic high when PDB is a logic low, avoiding possible data corruption of slave latch 22 logic state when exiting power down and the clock signal is a logic one. The power supply voltage is then removed from all of the gates of flip-flop 10 except for gates supplied by continuous power supply voltage VDDC (inverters 30 and 32 of latch 22 and NAND logic gate 38). When exiting power down mode, power supply voltage VDD is restored first. Inverter 24 is then enabled by the logic low power down signal PDB to transfer the state of slave latch 22 to master latch 14 before control signal PDB is deasserted. Note that inverter 24 is supplied by VDD. After control signal PDB is deasserted as a logic high, inverter 24 is disabled, inverters 12 and 26 are enabled and normal operation resumes.

Figure 2:
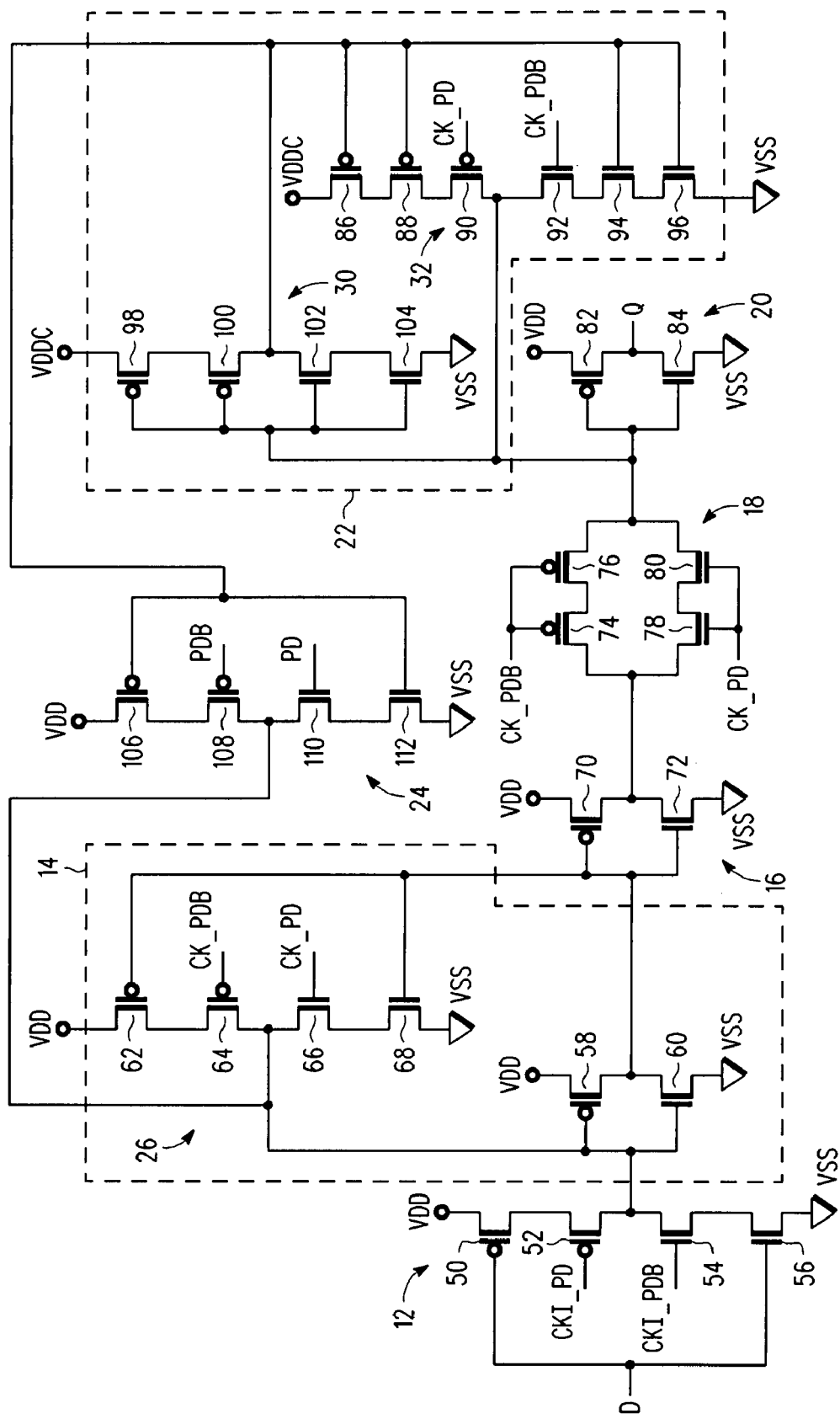
FIG. 2 illustrates, in schematic diagram form, the flip-flop of FIG. 1 in more detail.

FIG. 2 illustrates, in schematic diagram form, a more detailed embodiment of flip-flop 10 of FIG. 1. Note that in the various figures, the same reference numbers are used to represent the same or similar elements. In FIG. 2, clocked inverter 12 includes P-channel transistors 50 and 52, and N-channel transistors 54 and 56. Inverter 28 includes P-channel transistor 58 and N-channel transistor 60. Clocked inverter 26 includes P-channel transistors 62 and 64 and N-channel transistors 66 and 68. Inverter 16 includes P-channel transistor 70 and N-channel transistor 72. Transmission gate 18 includes series-connected P-channel transistors 74 and 76 and series-connected N-channel transistors 78 and 80. Inverter 20 includes P-channel transistor 82 and N-channel transistor 84. Inverter 30 includes P-channel transistors 98 and 100 and N-channel transistors 102 and 104. Inverter 32 includes P-channel transistors 86, 88, and 90, and N-channel transistors 92, 94, and 96. Each of inverters 12, 16, 16, 28 and 20 receive an interruptible power supply voltage labeled "VDD". Inverters 30 and 32 receive continuous power supply voltage VDDC. Note that inverter 30, clocked inverter 32, and transmission gate 18 includes multiple P-channel transistors connected in series and multiple N-channel transistors connected in series to reduce leakage current while in power down mode. In other embodiments, the inverters and transmission gate of the embodiment of FIG. 2 may be implemented differently. For example, inverter 30, clocked inverter 32, and transmission gate 18 may be implemented with single P-channel and single N-channel transistors. Also, in other embodiments, the series-connected transistors may include more than two transistors in series. In addition, in other embodiments, the transistors that receive the clocking and control signals may be located on the outside of the logic function transistors.

Figure 3:
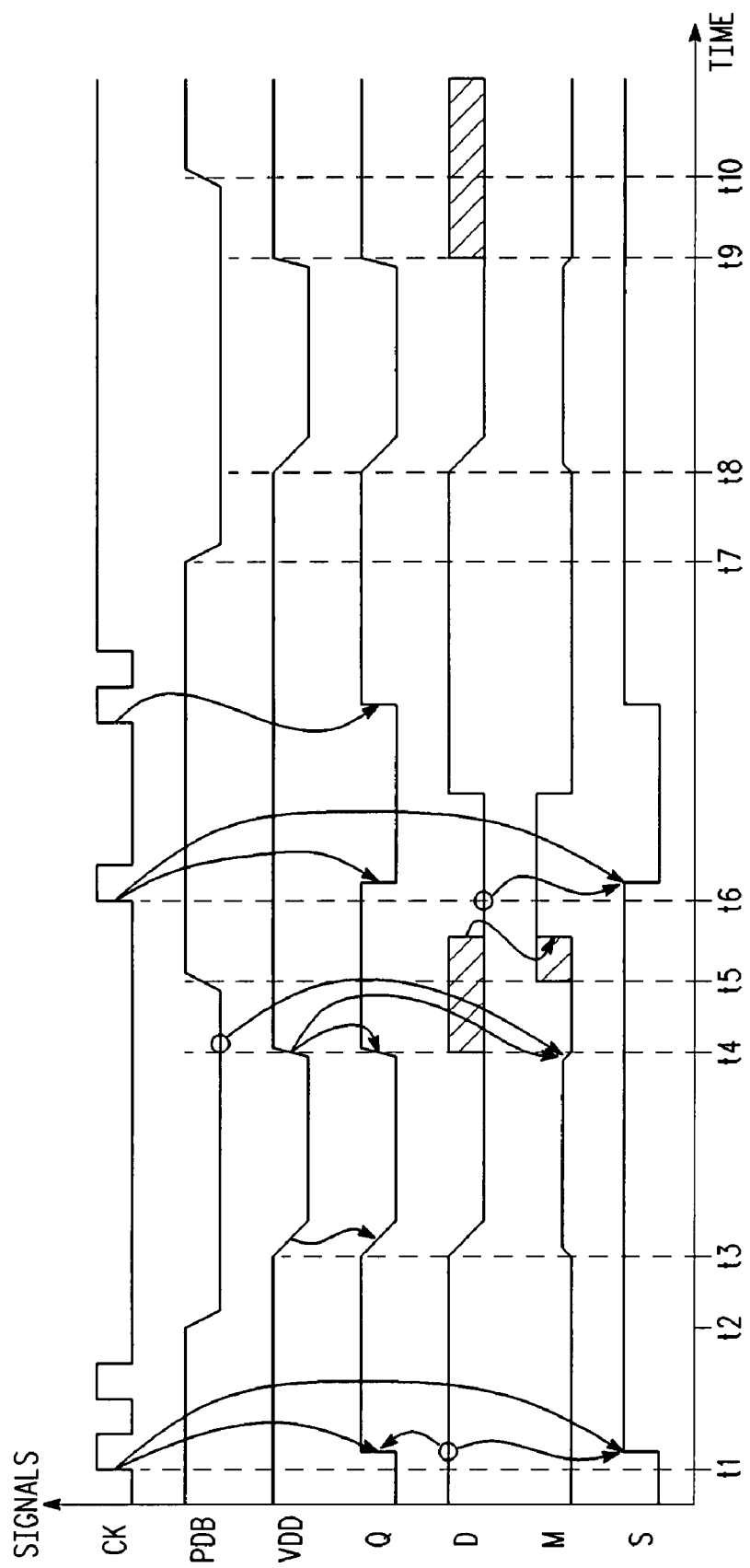
FIG. 3 illustrates a timing diagram of various signals regarding the flip-flip of FIG. 1 and FIG. 2.

FIG. 3 illustrates a timing diagram of various signals of the flip-flip 10 of FIG. 1 and FIG. 2. At time t1, flip-flop 10 is operating in a normal operating mode. Control signal PDB is a logic high and VDD is at a normal voltage. The rising edges of clock signal CK and the logic state of input signal D cause output signal Q to change. Also, the rising edges of clock signal CK and input signal D cause the state of signal S in the slave latch to change. At time t2, control signal PDB is asserted as a logic low to enter power down mode. Note that clock signal CK has been stopped as a logic zero. A power down period comprises a continuous time duration between the power down signal PDB becoming active and the power down signal PDB becoming inactive and wherein, during a portion of the power down period, power is removed from master latch 14 while slave latch 22 remains powered. After time t3, power supply voltage VDD is lowered, preferably to near ground potential. The lowering of VDD causes signals Q and D to be lowered to near ground potential. The voltage of internal signal M may be reduced to ground or may float as illustrated in FIG. 3. Flip-flop 10 is in power down mode between times t3 and t4 and the logic state of signal S represents the retained logic state of flip-flop 10. At time t4, flip-flop 10 begins exiting power down mode. Power supply voltage VDD rises and signals Q and D are restored accordingly. At time t5, power down control signal PDB is deasserted as a logic high, indicating operation in a normal operating mode. The stored logic high signal S initially causes master latch signal M to transition to a logic low. Between times t5 and t6 a falling edge of input signal D causes signal M to transition to a logic high. At time t6, flip-flop 10 is again operating in a normal operating mode. A rising edge of clock signal CK will cause signal output signal Q and slave latch signal S to change to a logic zero in response to a logic zero signal D.

At time t7, control signal PDB is asserted as a logic low and flip-flop 10 enters power down mode when clock signal CK is stopped as a logic high. At time t8, power supply voltage VDD is reduced to ground and the voltages of signals Q, D, and M follow. Note that signal M may float above ground in some embodiments. Flip-flop 10 is in power down mode between times t8 and t9 and the logic high state of signal S represents the retained logic state of flip-flop 10. At time t9, flip-flop 10 begins exiting power down mode. Power supply voltage VDD rises causing signals Q and D to be restored. The stored logic high signal S initially causes master latch signal M to transition to a logic low between times t9 and t10. After time t10, power down signal PDB returns to a logic high and a falling edge of input signal D causes signal M to transition to a logic high in response to clock signal CK. A rising edge of clock signal CK will cause signal output signal Q and slave latch signal S to change to a logic zero in response to a logic zero signal D.

By now it should be appreciated that there has been provided a flip-flop and method for state retention in a flip-flop. In one embodiment, the flip-flop includes a master latch and a slave latch connected together by an inverter in a feedback arrangement. The slave latch functions as a typical slave latch while in a normal operating mode. During a power down mode, the slave latch receives a continuous power supply voltage and functions to retain the last logic state of the flip-flop before power down mode was entered. The feedback inverter has an input directly connected to a storage node of the slave latch and an output directly connected to a storage node of the master latch. When exiting power down mode, and in response to a rising power supply voltage, the feedback inverter feeds back the logic state of the slave latch to restore the logic state of the master latch. The illustrated embodiment of the flip-flop allows entry and exit of power down mode without having to observe various clock state restrictions. This allows the flip-flop to be used in applications with restrictions on the stopped logic state of the clock. Also, when entering or exiting power down mode, the output Q of the present state retention flip-flop is prevented from toggling between logic states. These characteristics allow the flip-flop to be used in more applications than some prior art flip-flops.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The term "coupled," as used herein, is not intended to be limited to a direct coupling or a mechanical coupling.

What is claimed is:

1. A flip-flop, comprising:
   a master latch having an input for receiving an input signal and an output;
   a first inverter having an input coupled to the output of the master latch and an output for providing an output of the flip-flop;
   a slave latch directly connected to the input of the first inverter, wherein the master latch and the slave latch together function to provide a flip-flop operation during a normal operating mode, and wherein the slave latch functions to retain a logic state of the flip-flop during a power down operating mode; and
   a first clocked inverter having an input directly connected to the slave latch and an output coupled to the master latch, wherein the first clocked inverter functions to transfer the logic state to the master latch when operation of the flip-flop returns to the normal operating mode.

2. The flip-flop of claim 1, wherein the first clocked inverter is enabled in response to a power down signal becoming active.

3. The flip-flop of claim 2, further comprising a second inverter, wherein the output of the master latch is coupled to the input of the first inverter through the second inverter.

4. The flip-flop of claim 3, wherein a power down period comprises a continuous time duration between the power down signal becoming active and the power down signal becoming inactive and wherein, during a portion of the power down period, power is removed from the master latch and the first inverter and the slave latch remains powered.

5. The flip-flop of claim 4, further comprising a first transmission gate, wherein the output of the master latch is coupled to the input of the first inverter through the first transmission gate.

6. The flip-flop of claim 5, wherein the slave latch comprises:
   a third inverter having an input having an input directly connected to the input of the first inverter and an output coupled to the input of the first clocked inverter; and
   a second clocked inverter having an input coupled to the output of the third inverter and an output coupled to the input of the third inverter.

7. The flip-flop of claim 6, wherein the master latch comprises:
   a fourth inverter having an input for receiving the input signal and an output coupled to the input of the first inverter; and
   a third clocked inverter having an input coupled to the output of the fourth inverter and an output coupled to the input of the fourth inverter.

8. The flip-flop of claim 7, further comprising a fourth clocked inverter having an input for receiving a data signal and an output for providing the input signal.

9. The flip-flop of claim 8, further comprising a first clock circuit that has inputs that receive a clock signal and the power down signal and provides a first clocking signal to the second clocked inverter.

10. The flip-flop of claim 9, further comprising a second clock circuit that has inputs that receive the clock signal and the power down signal and an output that provides a second clocking signal to the fourth clocked inverter.

11. A method, comprising:
   during a normal mode of operation of a flip-flop comprising a master latch and a slave latch:
      latching an input signal in the master latch on a first edge of a clock signal;
      selectively coupling the input signal to an output circuit; and
      latching the input signal in the slave latch that is directly connected to the output circuit on a second edge of the clock signal;
   in response to entering a power down period:
      disabling the master latch; and
      coupling the slave latch to the master latch and transferring a logic state of the master latch to the slave latch;
   during a portion of the power down period; removing power from the master latch and the output circuit while retaining power to the slave latch; and
   in response to a termination of the power down period, which occurs after power has returned to the master latch, transferring the logic state of the slave latch back to the master latch, and decoupling the slave latch from the master latch.

12. The method of claim 11, wherein the step of coupling the slave latch to the master latch is performed by a clocked inverter that is enabled by a power down signal.

13. The method of claim 12, further comprising removing power from the clocked inverter during the portion of power down period.

14. The method of claim 13, further comprising restoring power to the clocked inverter after termination of the portion of the power down period and before termination of the power down period.

15. The method of claim 11, further comprising providing an output signal from the output circuit representative of the input signal latched in the slave latch after termination of the portion of the power down period and before termination of the power down period.

16. A flip-flop, comprising:
   a master latch having an input for receiving an input signal and output;
   an output circuit coupled to the master latch for providing an output signal of the flip-flop;
   a slave latch directly connected to the output circuit for storing a logic state received by the output circuit; and
   a first clocked inverter having an input directly connected to the slave latch and an output coupled to the master latch for providing the logic state stored in the slave latch to the master latch at a time prior to termination of a power down period;
   wherein the slave latch provides the logic state stored in the slave latch to the output circuit at the time prior to termination of a power down period, and
   wherein the output circuit provides the output signal responsive to the slave latch providing the logic state stored in the slave latch, and wherein during a portion of the power down period, power is removed from the master latch and the output circuit and the slave latch is powered.

17. The flip-flop of claim 16, wherein the first clocked inverter is clocked by a power down signal that defines a beginning and an end of the power down period.

18. The flip-flop of claim 16, wherein:
   the master latch comprises a first pair of cross coupled inverters in which one of the pair is clocked;

the slave latch comprises a second pair of cross coupled inverters in which one of the pair is clocked; and the output circuit is coupled to the master latch through a first inverter and a transmission gate.

19. The flip-flop of claim 18, further comprising a second clocked inverter for receiving a data signal and providing the input signal wherein the second clocked inverter, the master latch, the slave latch, and the transmission gate are clocked by signals derived from a clock signal and a power down signal.

* * * * *